United States Patent

Van Dijk et al.

(10) Patent No.: US 6,650,257 B2
(45) Date of Patent: Nov. 18, 2003

(54) INFORMATION CARRIER, DEVICE FOR ENCODING, METHOD FOR ENCODING, DEVICE FOR DECODING AND METHOD FOR DECODING

(75) Inventors: Marten E. Van Dijk, Eindhoven (NL); Willem M. J. M. Coene, Eindhoven (NL); Constant P. M. J. Baggen, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/175,410

(22) Filed: Jun. 19, 2002

(65) Prior Publication Data

US 2002/0163453 A1 Nov. 7, 2002

Related U.S. Application Data

(63) Continuation of application No. 09/535,904, filed on Mar. 23, 2000.

(30) Foreign Application Priority Data

Mar. 23, 1999 (EP) ............................................. 99200873

(51) Int. Cl.[7] ................................................. H03M 7/00
(52) U.S. Cl. .......................................... 341/59; 341/58
(58) Field of Search .............................. 341/59, 58, 39, 341/123; 375/295, 261; 369/47.53; 714/793, 821, 712; 455/701; 340/825.69

(56) References Cited

U.S. PATENT DOCUMENTS

| | | | | | |
|---|---|---|---|---|---|
| 5,072,435 | A | * | 12/1991 | Bakx | 469/116 |
| 5,115,438 | A | * | 5/1992 | Friederichs et al. | 714/788 |
| 5,136,436 | A | * | 8/1992 | Kahlman | 341/58 |
| 5,140,474 | A | * | 8/1992 | Kahlman et al. | 341/59 |
| 5,150,113 | A | * | 9/1992 | Bluthgen | 340/825.69 |
| 5,220,568 | A | * | 6/1993 | Howe et al. | 341/59 |
| 5,222,077 | A | * | 6/1993 | Krishnan | 375/261 |
| 5,243,343 | A | * | 9/1993 | Moriyasu | 324/102 |
| 5,282,209 | A | * | 1/1994 | Bonnerot | 375/260 |
| 5,341,479 | A | * | 8/1994 | Dean et al. | 360/72.2 |
| 5,388,122 | A | * | 2/1995 | Kawada et al. | 375/222 |
| 5,408,475 | A | * | 4/1995 | Lee | 370/242 |
| 5,432,786 | A | * | 7/1995 | Kawada | 329/304 |
| 5,563,908 | A | * | 10/1996 | Kaku et al. | 375/222 |
| 5,570,339 | A | * | 10/1996 | Nagano | 360/60 |
| 5,696,505 | A | * | 12/1997 | Schouhamer Immink | 341/59 |
| 5,748,119 | A | * | 5/1998 | Ko | 341/58 |
| 5,943,368 | A | * | 8/1999 | Bergmans et al. | 341/59 |

\* cited by examiner

*Primary Examiner*—Jean Bruner Jeanglaude
(74) *Attorney, Agent, or Firm*—Michael E. Belk

(57) ABSTRACT

An information carrier includes runlength limited marks in a track. The runlengths of the marks represent main channel bits and variations of a further parameter of the marks representing secondary channel bits. Not all marks have the variations, only marks of at least a predetermined runlength have the variations.

18 Claims, 4 Drawing Sheets

INFORMATION CARRIER, DEVICE FOR ENCODING, METHOD FOR ENCODING, DEVICE FOR DECODING AND METHOD FOR DECODING

This is continuation of application Ser. No. 09/535,904 filed Mar. 23, 2000.

BACKGROUND AND SUMMARY OF THE INVENTION

The invention relates to an information carrier comprising runlength limited marks in a track, the runlengths of the marks representing main channel bits and variations of a further parameter of the marks representing secondary channel bits.

The invention further relates to a device for encoding, a method for encoding, a device for decoding and a method for decoding.

The invention is applicable to record carriers with different kinds of channel codes. In a channel code source bits are encoded to channel bits according to a predetermined scheme. Information may be stored on record carriers channel coded, for example, in accordance with a runlength-limited (RLL) code. A RLL code is characterized by two parameters, (d+1) and (k+1), which stipulate the minimum and maximum runlengths, respectively, that may occur in the code. The length of time usually expressed in channel bits between consecutive transitions from type of mark is known as the runlength. Such a transition can for example be a transition from a pit-mark to a land-mark, e.g. in CD-DA, CD-R, or a transition from an amorphous domain to a crystalline domain, e.g. in CD-RW.

An information carrier mentioned in the foregoing is known from European Patent Application EP 0 866 454 A2. This document discloses an optical recording medium in which a run length limited channel code is recorded in the form of a mark. The information encoded in this channel code comprises main data and encryption data, encryption data being represented by a width of the mark. During read-out different levels of the read signal have to be detected. This encryption data can not be detected in a very reliable manner.

The invention has for an object to create a more reliable secondary channel, the secondary channel being related to a main channel.

The information carrier in accordance with the invention is characterized namely in that only marks of at least a predetermined runlength have said variations. In this invention, the secondary channel is made reliable in the manner on which the secondary channel is related to the main channel.

The invention is based on the recognition that the reliability of a secondary channel is not equal for all runlengths for which this secondary channel is added to the main channel using multi-level coding.

Multi-level coding can be achieved in different ways. With multi-level coding is meant the coding which uses the different levels of the read-out signal, obtained when reading out a record carrier, to decode data stored on the record carrier. These different levels of the read-out signal can for example be accomplished by changing the geometry of a pit or mark to be read out from the record carrier. This change in geometry can be of different kinds, variation of the width, depth, the number of width or depth variations etc. A physical parameter of the secondary channel can be used for multi-level coding, e.g. a so-called "peanut"-structure can be made, or the depth and/or width of the pits and marks can be varied. The main channel is a binary channel where pits and non-pits (lands) are related to two possible signal levels (below and above a threshold level).

The parameter $n_{min}$, which indicates this minimal runlength for which the secondary channel is created, is chosen to be such that normal timing recovery in the main channel is not affected. The secondary channel is hierarchically dependent on the main channel, since secondary channel bits can only be accommodated at those locations in the channel bit stream, where the main channel coding uses longer runlengths. This secondary channel is therefore called to be realized via limited multi-level (LML) coding. The limitation consists of the choice that multi-level coding is only applied for a predetermined minimum runlength.

Using this LML coding technique constitutes advantages. In general, writing short runlengths is more difficult. Experiments have shown that the jitter in the main channel due to pit-land modulation, e.g. modulating the width of a pit, increases for shorter runlengths. Due to this increase in jitter, the read-out reliability of the main channel decreases. As the read-out signal is situated closer to the normal slicer level, the chance of misdetecting such a short runlength is increased. As said before, for short runlengths the equalized eye-pattern is not saturated. In order to be able to detect and reconstruct the secondary channel bit from short runlengths it is therefore necessary to use more slicer levels than when only long runlengths are used for storing the secondary channel bits. These difficulties are overcome if multi-level coding is only applied for a predetermined minimum runlength.

By creating the secondary channel extra capacity can be generated on top of the capacity of the main channel. When reading out a record carrier comprising a secondary channel a traditional player can only see the information stored in the main channel, while a enhanced player, equipped with means for reading out and decoding the secondary channel, can also see the information stored in the secondary channel.

An additional advantage is that the data capacity of a record carrier can be increased by creating the secondary channel.

Another information carrier in accordance with the invention is characterized in that the parameter is the width of the mark or space.

Another information carrier in accordance with the invention is characterized in that the runlength limited data obeys constraints d=2, k=10, and in that the predetermined minimum runlength is 6.

As said before, the minimal runlength for which the secondary channel is created is chosen to be such that normal timing recovery in the main channel is not affected. For example, for DVD, a reasonable value for $n_{min}$ is 6, since the equalized eye-pattern under DVD-conditions reaches saturation (i.e. maximum amplitude level for land-marks and minimum amplitude for pit-marks) already for 16-runlengths.

Another information carrier in accordance with the invention is characterized in that the secondary channel of data also comprises error-correction data.

Another information carrier in accordance with the invention is characterized in that the marks are pits and lands, the pits having a reduced depth, the lands having a pit of small depth.

As said before, multi-level coding can be performed in different ways. For example, the pits and lands can be mastered in a so-called "peanut"-structure which is realized by turning off the laser at a predetermined place and for a predetermined time in the case of a pit and by turning on the laser at a predetermined place and for a predetermined time in the case of a land. In this way, the pits will have a reduced depth and the lands will have a pit of a small depth.

The device for encoding in accordance with the invention comprises converting means for converting a binary source signal into a channel signal, the channel signal comprising a main channel signal representing main channel bits and a secondary channel signal representing secondary channel bits, the converting means being further arranged for detecting the runlengths of the main channel bits and the converting means further comprising inserting means for generating the secondary channel signal only upon detecting a runlength of a predetermined minimum runlength.

The method for encoding in accordance with the invention comprises the step of converting a binary source signal into a channel signal, the channel signal comprising a main channel signal representing main channel bits and a secondary channel signal representing secondary channel bits, the method further comprising the step of detecting the runlengths of the main channel bits and the method further comprising the step of generating the secondary channel signal only upon detecting a runlength of a predetermined minimum runlength.

The device for decoding in accordance with the invention comprises decoding means for decoding a channel signal into a binary source signal, the channel signal comprising a main channel signal comprising main channel bits and a secondary channel signal comprising secondary channel bits, the device further comprising detecting means for detecting the runlengths of the main channel bits, the decoding means being further arranged for detecting the secondary channel only upon detecting a runlength of a predetermined minimum runlength.

The method for decoding in accordance with the invention comprises the step of decoding a channel signal into a binary source signal, the channel signal comprising a main channel signal comprising main channel bits and a secondary channel signal comprising secondary channel bits, the method further comprising the step of detecting the runlengths of the main channel bits and the method further comprising the step of detecting the secondary channel only upon detecting a runlength of a predetermined minimum runlength.

BRIEF SUMMARY OF THE DRAWINGS

The invention will be further described in the following Figure description in which.

DETAILED DESCRIPTION

Figure 1:
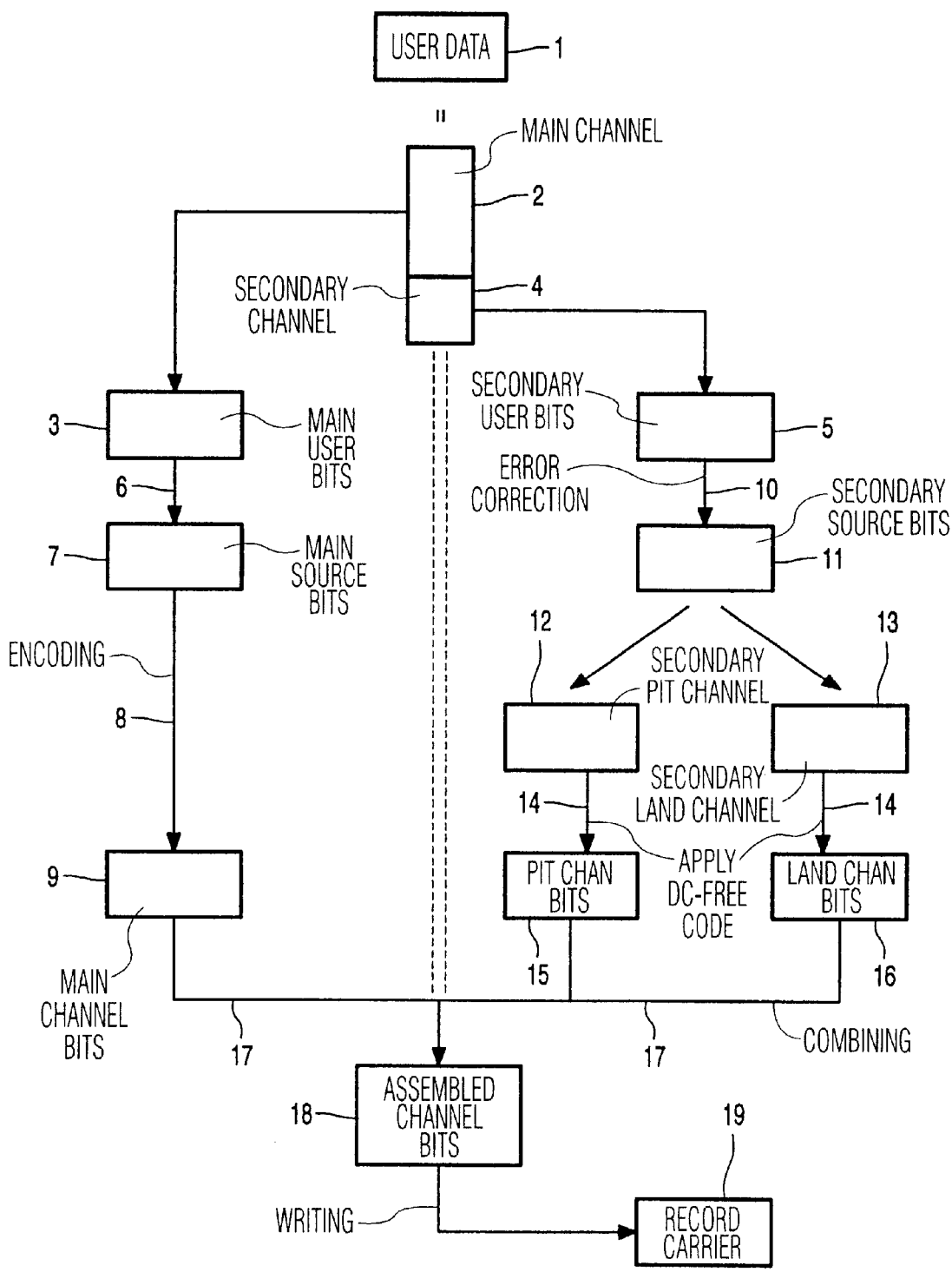
FIG. 1 shows an embodiment of an encoding method.

FIG. 1 shows an embodiment of an encoding method. User data 1 is partitioned between the main channel 2, comprising main user bits 3, and the secondary channel 4, comprising secondary user bits 5. In step 6, error correction is applied on the main user bits 3, yielding main source bits 7. These main source bits 7 comprise user data and parities generated in step 6. In step 8, encoding of the main source bits 7 yields the main channel bits 9 without the amplitude information. The encoding in step 8 can be accomplished, for example, via a standard RLL channel code, e.g. EFM$^+$, well known to a person skilled in the art.

In step 10, error correction is applied on the secondary user bits 5, yielding secondary source bits 11. These secondary source bits 11 comprise user data and parities generated in step 10. The secondary source bits 11 are further split into a secondary pit channel 12, with secondary pit bits and a secondary land channel 13, with secondary land bits. In step 14, a d=0 DC-free channel code is used for encoding both channels to generate secondary pit channel bits 15 and secondary land channel bits 16. An example of such a d=0 channel code is the 8-to-9 d=0 code as can be found in U.S. Pat. No. 5,642,113. The DC-free property of the code used for encoding is needed in order to retrieve (during the secondary channel detection) the slicer level from the measured waveform for detection of the secondary channel bits.

The secondary channel bits yield the amplitude information to be incorporated in the waveform that is to be generated from the secondary channel bitstream. In step 17, the main channel bits 9, the secondary pit channel bits 15 and the secondary land channel bits 16 are combined to the assembled channel bits 18. These assembled channel bits 18 are then written on a record carrier 19.

When writing the assembled channel bits on the record carrier, the multi-level coding is only applied for runlengths In$_{min}$ or greater, in which In$_{min}$ is a predetermined value. This multi-level coding can be performed in different ways. For example, the pits and lands can be mastered in a so-called "peanut"-structure which is realized by turning off the laser at a predetermined place and for a predetermined time in the case of a pit and by turning on the laser at a predetermined place and for a predetermined time in the case of a land. Also a narrower pit structure can be used for multi-level coding. The method according to the invention is not limited to multi-level coding of a particular kind. In the present embodiment, limited multi-level coding is used, but the method according to the invention is not limited to this so-called limited-level coding. More information about multi-level coding can be found in European Patent Application EP 0 866 454 A2 and International Publication WO 97/35304.

The secondary channel 2 is dependent on the main channel 4 due to the linking of the secondary amplitude effect with the longer runlengths. The detection problem caused by the hierarchy between main and secondary channels will be explained for the case In$_{min}$=6. Suppose, for instance, that a channel error occurred in the main channel (a simple transition shift) which turned an I5 into an I6. The first run does not carry an additional bit, whereas the second one does. Therefore, straightforward detection of the secondary channel yields a bit insertion. A bit deletion takes place when an I6 is turned into an I5 during RLL detection. In fact, simple transition shifts in the RLL channel can lead to bit slips (bit insertions and bit deletions) in the LML channel. This is further explained with reference to FIG. 2.

Figure 2A:
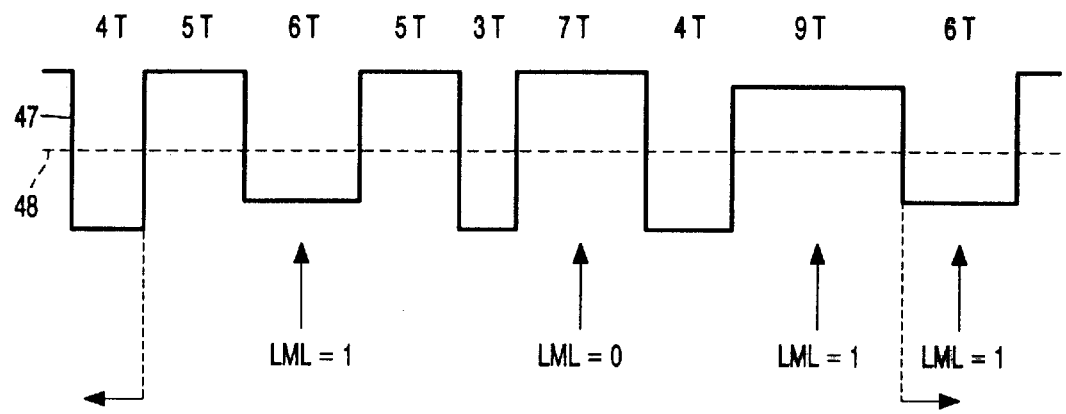
FIG. 2 shows the presence and origin of bit slips in the secondary channel.

FIG. 2 shows the presence and origin of bit slips in the secondary channel. In FIG. 2a, an original RLL sequence 47 is shown with runlengths 4T, 5T, 6T, 5T, 3T, 7T, 4T, 9T and 6T, as is indicated in this Figure above the sequence 47. The dashed line 48 indicates the normal slicer level used for detection of the main channel. LML=0 and LML=1 under the sequence 47 indicate what sort of secondary/LML-source bit is present in the indicated runlength. The meaning of LML=0 and LML=1 is explained using FIG. 3.

Figure 3:
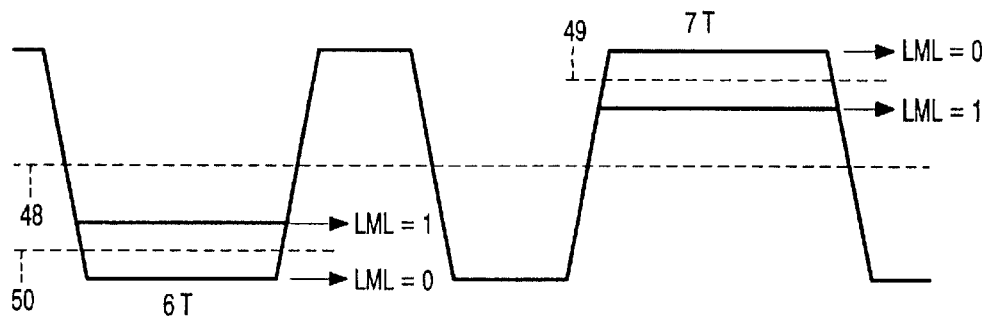
FIG. 3 shows an embodiment of the detection of the secondary channel.

FIG. 3 shows an embodiment of the detection of the secondary channel. Secondary channel detection is performed on the basis of the signal waveform and checks, via a slicer operating on the amplitude e.g. in the middle of the run, if runs have the secondary channel amplitude effect or not. One stores the information of the secondary channel effect on all runs on a symbol-by-symbol basis (for symbols of a length equal to n channel bits). One could also decide just to store this information for all runs ranging from an $I(n_{min}-1)$ and larger, if single-bit transition shifts are the main error source in the main channel. The storage on a symbol-by-symbol basis is needed in order to avoid problems with missing runs in the main channel, i.e. short runlengths of which the signal waveform does not reach beyond the slicer level of the main channel, which can occur with low probability.

For runlengths 6T and 7T it is indicated how the secondary/LML bits are detected. The dashed line 49 indicates the LML-land slicer level used for detecting the secondary/LML-land bits. The dashed line 50 indicates the LML-pit slicer level used for detecting the secondary/LML-pit bits. Depending on the detection with these slicer levels 49 and 50, the character of the LML-bit is indicated by LML=0 or LML=1. The slicer levels 49 and 50 are used to decide whether runs have the secondary channel amplitude effect or not.

Figure 2B:
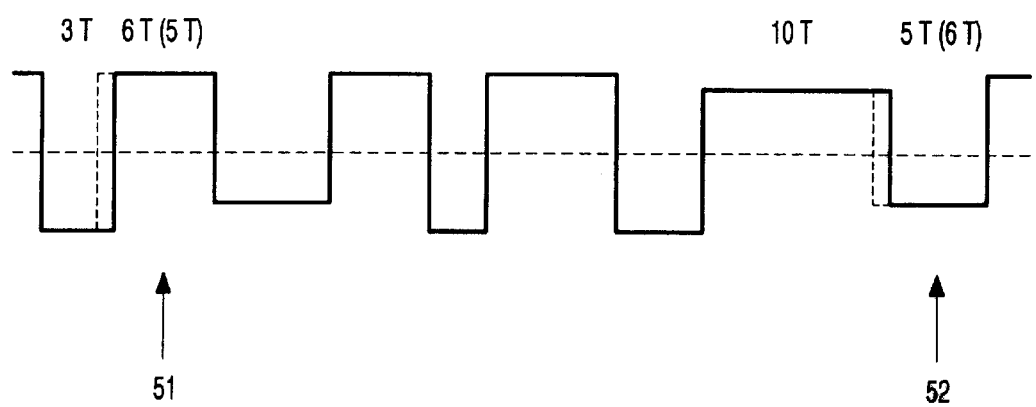

FIG. 2b shows the principle of LML-bit insertion and LML-bit deletion. Arrow 51 indicates the presence of LML-bit insertion as the original runlength 5T from FIG. 2a is detected as a 6T runlength. In this case, a bit insertion takes place when an I5 is turned into an I6 during RLL detection if for the parameter $n_{min}$ is $n_{min}=6$. Arrow 52 indicates the presence of LML-bit deletion as the original runlength 6T from FIG. 2a is detected as a 5T runlength. In this case, a bit deletion takes place when an I6 is turned into an I5 during RLL detection if for the parameter $n_{min}$ is $n_{min}=6$.

Figure 4:
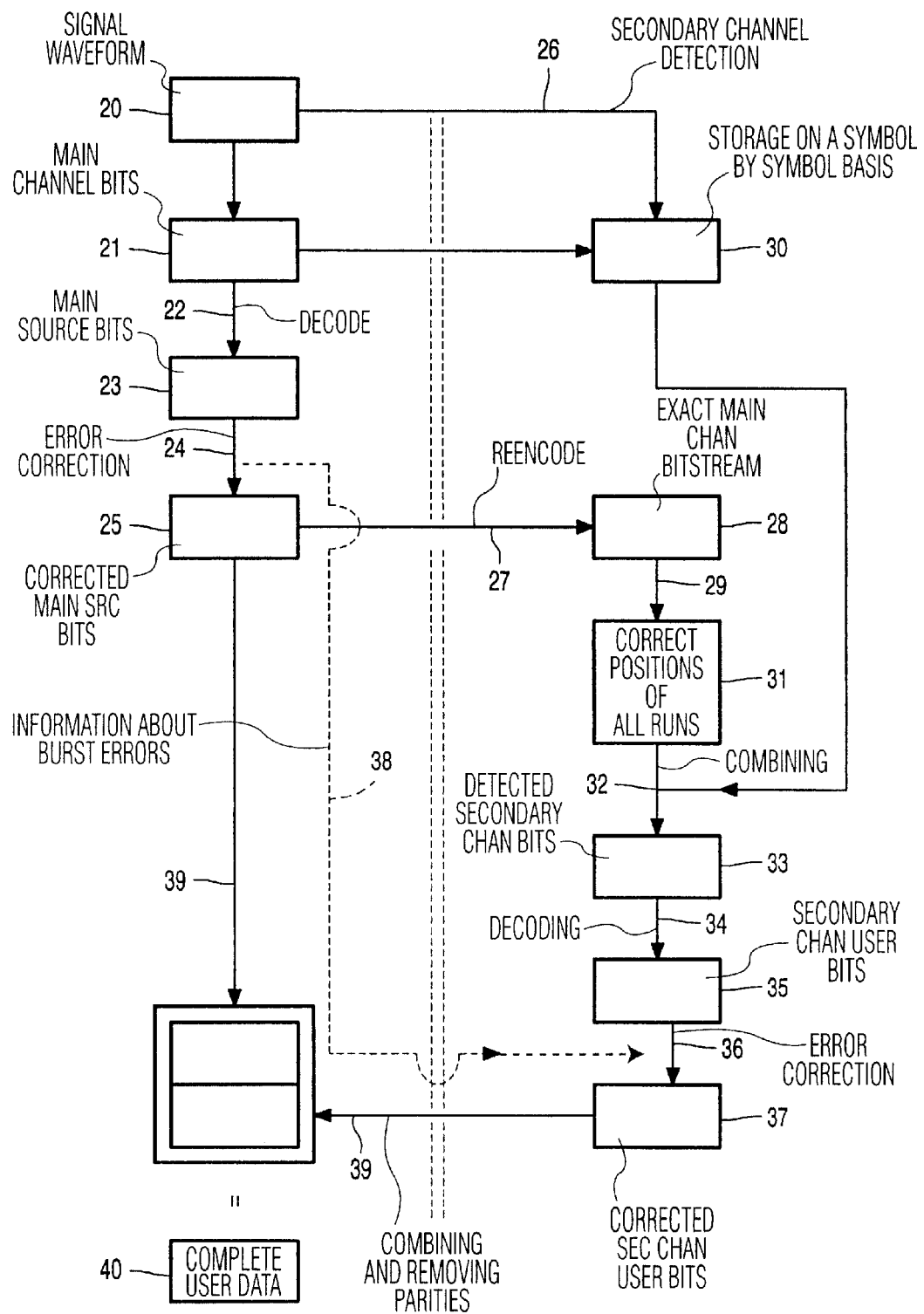
FIG. 4 shows an embodiment of a decoding method according to the invention.

The solution to the above problem of bitslips is described in FIG. 4. It shows an embodiment of a decoding method according to the invention. The main channel bits are detected from the signal waveform 20. The method of decoding the main channel bits into the main user bits is just the standard one, well known to a person skilled in the art: in step 22, the main channel bits 21 are decoded into the main source bits 23, in step 24, the error-correction is applied on the main source bits 23, which yields the corrected main source bits 25. These corrected main source bits 25 comprise user data plus parities.

In this embodiment of a decoding method according to the invention, the detection of the secondary channel requires the following: In step 26, secondary channel detection is accomplished. During the detection of the main channel, channel errors may lead to erroneous runlengths in the main channel bitstream, i.e. detected runlengths may be different from encoded runlengths. Therefore it is first assumed that each runlength carries a potential secondary channel bit, and secondary channel detection is performed on each runlength. Note that an actual secondary channel bit is detected only if the encoded runlength is not smaller than $In_{min}$. In step 26, secondary channel detection is performed on the basis of the signal waveform and checks, via a slicer operating on the amplitude in the middle of the run, if runs have the secondary channel amplitude effect or not (i.e. if a potential LML bit has value 1 or 0). One stores the information of the secondary channel effect on all runs on a symbol-by-symbol basis in block 30. One could also decide just to store this information for all runs ranging from an $I(n_{min}-1)$ and larger if single-bit transition shifts are the main error source in the main channel. The storage on a symbol-by-symbol basis is needed in order to avoid problems with missing runs, i.e. short runlengths of which the signal waveform does not reach beyond the slicer level of the main channel.

After error correction of the main channel in step 24, the corrected main source bits 25 are re-encoded in step 27, yielding the exact main channel bitstream 28. In step 29, this exact main channel bitstream 28 is used to yield the correct position of all runs in the main channel bit stream and is shown in block 31. In step 32, this exact knowledge of the occurrence of the long runlengths, stored in block 31, is combined with the secondary channel info about potential secondary channel bits, stored in block 30, which yields the detected secondary channel bits 33. In step 34, decoding of the secondary channel yields the secondary channel user bits 35. In step 36, traditional error correction of the secondary channel finally yields the corrected secondary channel user bits 37. In step 39, the secondary channel user data 37 are combined with the user data of the main channel 25 (i.e. the corrected main source bits), to reassemble the complete user data 40. Also in this step 39, the parities are removed.

The embodiment as described above is to be considered as one example to which the decoding method according to the invention is applicable. The error correction of the secondary channel (step 36) can be improved via information generated during the error correction of the main channel (step 24). This is indicated by the dashed line 38. E.g. information about burst errors generated from the main channel error correction can be used as erasure information for the error correction of the secondary channel.

As an example, some characteristics of applying this method according to the invention are given. For a maxentropic d=2, k=10 RLL sequence, the extra capacity available in the secondary/LML channel for $In_{min}=6$ amounts to 11.5% on average. For sufficiently long data sequences, the distribution of the extra capacity in the secondary/LML channel becomes very narrow. For a complete sector of 64 kb, a capacity of 11.3% can practically always be guaranteed (probability of $1-10^{-15}$), i.e. the probability that it cannot be guaranteed is smaller than the miscorrection probability of the error correction coding (ECC) (probability of $10^{-12}$) to be discussed. If the same overhead for ECC applies to both main/RLL and secondary/LML channels, then only the overhead for the channel coding of the secondary/LML-source bits is to be taken into account.

The LML-channel code is essentially a DC-free d=0 code which allows enabling slicer control on the additional amplitude levels in pits and lands. Even for the low-rate 8-to-9 d=0 code (with an overhead of 12.5%; see U.S. Pat. No. 5,642,113 a final capacity increase of about 10.0% is achievable on top of the capacity of the RLL channel.

In addition to this, scramblers may be used for accommodating a balance between short and long runlengths which may be useful for a steady sensitivity of the tracking servos (radial push-pull). Besides, to achieve full capacity, a scrambler may be used to guarantee the capacity of the secondary/LML channel.

Figure 5:
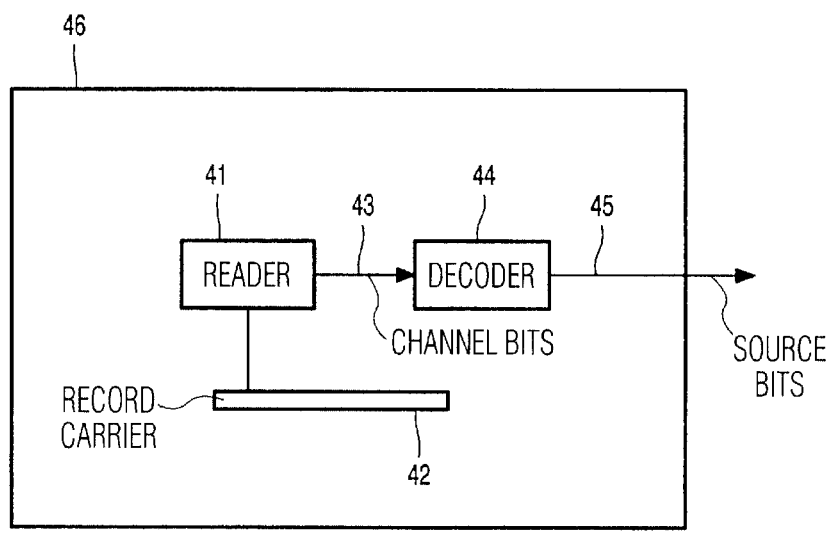
FIG. 5 shows an embodiment of a decoding device according to the invention.

FIG. 5 shows an embodiment of a decoding device 46 according to the invention. The device comprises reading means 41 for reading a record carrier 42, e.g. a DVD-ROM. These reading means 41 comprise an optical system for generating a focused light spot on the record carrier 42 and a detector for detecting the reflected light spot. The reading means 41 produce a stream of channel bits of a signal relating to a binary channel 43. This stream of channel bits of a signal relating to a binary channel 43 is decoded in a decoder 44 into a stream of source bits of a signal relating to a binary source 45. The decoder 44 comprises standard means for decoding a RLL channel code, e.g. (EFM$^+$)$^{-1}$ and means for error correction, e.g. CIRC-correction, both well known to a person skilled in the art. The decoder 44 further comprises means for decoding a secondary channel in accordance with the method according to the invention. Decoding this secondary channel is performed upon detecting the runlengths of the binary channel signal 43. The stream of source bits of a signal relating to a binary source 45 is outputted by the device 46 and can be further processed, e.g. for playing audio information, or for screening video information.

While the invention has been described with reference to preferred embodiments thereof, it is to be understood that these are not limitative examples. Thus, various modifications may become apparent to those skilled in the art, without departing from the scope of the invention, as defined in the claims.

Furthermore, the invention lies in each and every novel feature or combination of features.

What is claimed is:

1. An information carrier comprising:
   a substrate with a track;
   variations of a first parameter of the track, the variations of the first parameter representing main channel bits; and
   variations of a further parameter of the track representing secondary channel bits, the variations of the first parameter having runlengths, only portions of the track having a runlength of at least a predetermined minimum runlength have the variations of the further parameter, information represented by the main channel bits and the secondary channel bits both include information that is independent of track position, the predetermined minimum runlength being chosen such that normal timing recovery of the main channel bits is not affected by the secondary channel bits.

2. The carrier of claim 1, in which the further parameter is the width of a mark or space between marks.

3. The carrier of claim 1, in which the runlength obeys constraints d=2, k=10, and in that the predetermined minimum runlength is 6.

4. The carrier of claim 1, in which the information represented by the secondary channel bits includes error-correction data.

5. The carrier of claim 1, in which the first variations are marks formed by pits and lands in a track, and the secondary variations being variations in the depth of the pits and lands.

6. A channel signal carried by a medium, comprising:
   variations of a first parameter of the medium, the variations of the first parameter representing main channel bits; and
   variations of a further parameter of the medium representing secondary channel bits, the variations of the first parameter having runlengths, only portions of the signal having a runlength of at least a predetermined minimum runlength have the variations of the further parameter, the predetermined minimum runlength being chosen such that normal timing recovery of the main channel bits is not affected by the secondary channel bits.

7. The signal of claim 6, in which the information represented by the secondary channel bits includes error-correction data.

8. The signal of claim 6, in which the runlength obeys constraints d=2, k=10, and in that the predetermined minimum runlength is 6.

9. A channel signal representing information, comprising:
   a main channel signal with bits representing portions of the information; and
   a secondary channel signal with bits representing other portions of the information, the bits of the main channel signal having a runlength, the secondary channel signal only existing when the runlength of the bits of the main channel bits is less than a predetermined minimum runlength, the predetermined minimum runlength being chosen such that normal timing recovery of the main channel bits is not affected by the secondary channel bits.

10. The signal of claim 9, in which the information represented by the secondary channel bits includes error-correction data.

11. The signal of claim 9, in which the runlength obeys constraints d=2, k=10, and in that the predetermined minimum runlength is 6.

12. A device for encoding comprising:
    means for receiving a binary source signal; and
    converting means for converting the binary source signal into a channel signal, the channel signal including a main channel signal representing main channel bits and a secondary channel signal representing secondary channel bits, the converting means being further arranged for detecting the runlengths of the main channel bits and the converting means including inserting means for generating the secondary channel signal only upon detecting a runlength of a predetermined minimum runlength, the converting means further including splitting means for splitting secondary source bits derived from the binary source signal into secondary pit channel bits and secondary land channel bits, the splitting means applying DC-free channel code to implement said splitting, the secondary channel bits comprising the secondary pit channel bits and the secondary land channel bits.

13. A device for encoding comprising:
    means for receiving a binary source signal; and
    converting means for converting the binary source signal into a channel signal, the channel signal including a main channel signal representing main channel bits and a secondary channel signal representing secondary channel bits, the converting means detecting the runlengths of the main channel bits and generating the secondary channel signal only upon detecting a runlength of a predetermined minimum runlength, both the main channel bits and the secondary channel bits representing portions of the binary source signal, the converting means further including splitting means for splitting secondary source bits derived from the binary source signal into secondary pit channel bits and secondary land channel bits, the splitting means applying DC-free channel code to implement said splitting, the secondary channel bits comprising the secondary pit channel bits and the secondary land channel bits.

14. A optical recorder comprising;
    means for receiving a binary source signal;
    converting means for converting the binary source signal into a channel signal, the channel signal including a main channel signal representing main channel bits and a secondary channel signal representing secondary channel bits, the converting means being further arranged for detecting the runlengths of the main channel bits and the converting means including inserting means for generating the secondary channel signal only upon detecting a runlength of a predetermined minimum runlength, the converting means including splitting means for splitting secondary source bits derived from the binary source signal into secondary pit channel bits and secondary land channel bits, the splitting means applying DC-free channel code to implement said splitting, the secondary channel bits comprising the secondary pit channel bits and the secondary land channel bits; and means for providing the channel signal in the track of an optical record carrier, said means for providing the channel signal including means for combining the main channel bits, the secondary pit channel bits, and the secondary land channel bits into assembled channel bits of the channel signal.

15. An optical player comprising:

decoding means for decoding a channel signal into a binary source signal, the channel signal including a main channel signal including main channel bits and a secondary channel signal including secondary channel bits;

detecting means for detecting the runlengths of the main channel bits, the decoding means decoding the secondary channel only upon detecting a runlength of a run of the main channel signal having a predetermined minimum runlength and only upon detecting an amplitude of the secondary channel via a slicer operating on the amplitude at the channel signal in the middle of the run, both the main channel bits and the secondary channel bits representing portions of the binary source signal; and reading means for reading out the channel signal from a record carrier.

16. A method for decoding comprising decoding a channel signal into a binary source signal, the channel signal including a main channel signal including main channel bits and a secondary channel signal including secondary channel bits, both the main channel bits and the secondary channel bits being decoded to form portions of the binary source signal;

detecting the runlengths of the main channel bits; and decoding the secondary channel only upon detecting a runlength of a run of the main channel signal having a predetermined minimum runlength and only upon detecting an amplitude of the secondary channel via a slicer operating on the amplitude of the channel signal in the middle of the run.

17. A method as claimed in claim 16, wherein the method further comprises reading the channel signal from a record carrier.

18. A method of producing optical record carriers, comprising:

receiving a binary source signal;

converting the binary source signal into a channel signal, the channel signal including a main channel signal representing main channel bits and a secondary channel signal representing secondary channel bits, the converting including detecting the runlengths of the main channel bits and generating the secondary channel signal only upon detecting a runlength of the main channel bits is at least a predetermined minimum runlength, said converting including deriving secondary source bits from the binary source signal and splitting the secondary source bits into secondary pit channel bits and secondary land channel bits through application of DC-free channel code, the secondary channel bits comprising the secondary pit channel bits and the secondary land channel bits; and providing the channel signal in the track of an optical record carrier.

* * * * *